(12) United States Patent
Park

(10) Patent No.: US 7,851,845 B2
(45) Date of Patent: Dec. 14, 2010

(54) FLASH MEMORY DEVICE AND METHOD OF MANUFACTURING THE SAME

(75) Inventor: Jin-Ha Park, Echeon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/325,164

(22) Filed: Nov. 29, 2008

(65) Prior Publication Data
US 2009/0140314 A1    Jun. 4, 2009

(30) Foreign Application Priority Data
Nov. 29, 2007  (KR) .............. 10-2007-0122674

(51) Int. Cl.
*H01L 29/788* (2006.01)
*H01L 29/792* (2006.01)
*H01L 21/336* (2006.01)

(52) U.S. Cl. ............ 257/315; 257/314; 257/324; 257/E29.3; 257/E29.309; 438/287

(58) Field of Classification Search ........... 257/315, 257/324, 214, 326, E29.3, E29.309, E29.308, 257/E21.208, E21.209, E21.409
See application file for complete search history.

(56) References Cited

U.S. PATENT DOCUMENTS 5,281,548 A * 1/1994 Prall ............... 438/259
7,060,560 B2   6/2006 Wu et al.
2002/0040992 A1   4/2002 Manabe et al.
2005/0064666 A1 * 3/2005 Kim ............... 438/286
2005/0162884 A1   7/2005 Jung
2006/0220095 A1 * 10/2006 Kim ............... 257/315

* cited by examiner

*Primary Examiner*—Victor A Mandala
*Assistant Examiner*—Whitney Moore
(74) *Attorney, Agent, or Firm*—Sherr & Vaughn, PLLC

(57) ABSTRACT

Embodiments relate to a flash memory device and a method of manufacturing the same that may include a tunnel oxide layer on and/or over a semiconductor substrate having source and drain regions. The tunnel oxide layer may have a first width. The flash memory device may include a first polysilicon pattern and a second polysilicon pattern on and/or over the tunnel oxide layer and a dielectric pattern on and/or over the tunnel oxide layer, where the first and second polysilicon patterns may be provided. It may also include a third polysilicon pattern on and/or over the dielectric pattern, the third polysilicon pattern having a second width, and a spacer formed on and/or over sidewalls of the first, second and third polysilicon patterns, the dielectric pattern and the tunnel oxide pattern. According to embodiments, the second width may be greater than the first width.

11 Claims, 5 Drawing Sheets

FLASH MEMORY DEVICE AND METHOD OF MANUFACTURING THE SAME

Figure 1:
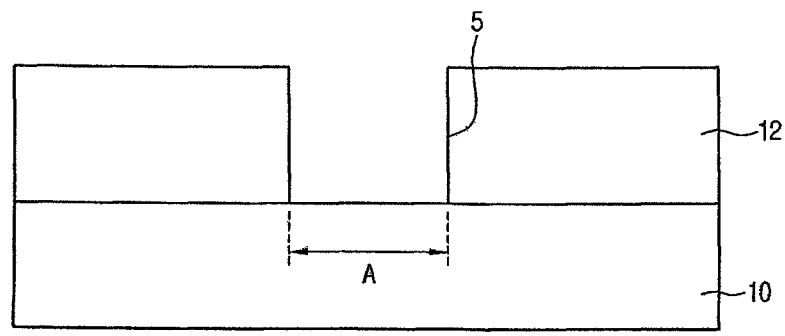

The present application claims priority under 35 U.S.C. 119 to Korean Patent Application No. 10-2007-0122674 (filed on Nov. 29, 2007), which is hereby incorporated by reference in its entirety.

BACKGROUND

A flash memory device may be a nonvolatile memory device, and may retain stored data even if power supply is stopped. In addition, a flash memory device may have a high data processing speed in writing, reading, and erasing data.

Such a flash memory device may be widely used for data storage of a basic input/output system (BIOS) of PC, a set-topbox, a printer, a network server, or the like. A flash memory may also be used for a digital camera, a cellular phone, or the like.

SUMMARY

Embodiment relate to a flash memory device and a method of manufacturing the same that may include at least one of the following: a tunnel oxide layer with a first width on and/or over a semiconductor substrate comprising source and drain regions; a first polysilicon pattern and a second polysilicon pattern on and/or over the tunnel oxide layer; a dielectric pattern on and/or over the tunnel oxide layer where the first and second polysilicon patterns are provided; a third polysilicon pattern with a second width on and/or over the dielectric pattern; a spacer formed on and/or over sidewalls of the first, second and third polysilicon patterns, the dielectric pattern, and the tunnel oxide pattern. According to embodiments, the second width may be greater than the first width.

Embodiments relate to a device that may include at least one of the following: a tunnel oxide layer having a first width over a semiconductor substrate, the semiconductor substrate including source and drain regions; a first polysilicon pattern and a second polysilicon pattern over the tunnel oxide layer; a dielectric pattern over the tunnel oxide layer and the first and second polysilicon patterns; and a third polysilicon pattern over the dielectric pattern, the third polysilicon pattern having a second width such that the second width is greater than the first width.

Embodiments relate to a device that may include at least one of the following: a floating gate formed over a semiconductor substrate; and a control gate formed over the floating gate such that a pattern for the floating gate has a first width and a pattern for the control gate has a second width, the second width being greater than the first width.

Embodiments relate to a method that may include at least one of the following: forming first oxide patterns over a semiconductor substrate; and then forming a tunnel oxide layer over the semiconductor substrate between the first oxide patterns; and then forming first and second polysilicon patterns over sidewalls of the first oxide patterns over the tunnel oxide layer; and then forming a dielectric layer and a polysilicon layer over the first polysilicon pattern, the second polysilicon pattern, and the first oxide patterns; and then performing an etching process to form a second oxide pattern over sidewalls of the first and second polysilicon patterns, and to form a dielectric pattern and a third polysilicon pattern over the first and second polysilicon patterns and the second oxide pattern. According to embodiments, the tunnel oxide layer over which the first and second polysilicon patterns are formed has a first width, and the third polysilicon pattern has a second width greater than the first width.

DRAWINGS

Example FIGS. 1 through 9 are cross-sectional views illustrating a flash memory device and a method of manufacturing the same, according to embodiments.

DESCRIPTION

Example FIGS. 1 through 9 are cross-sectional views illustrating a flash memory device and a method of manufacturing the same, according to embodiments.

Referring to example FIG. 1, first oxide pattern 12 may be formed on and/or over semiconductor substrate 10. First oxide pattern 12 may be formed such that a first oxide layer may be formed on and/or over semiconductor substrate 10. Trench 5 may then be formed by removing a portion of the first oxide layer where a gate may later be formed through a patterning process. According to embodiments, first oxide pattern 12 may be formed of tetra ethyl ortho silicate (TEOS), and trench 5 may have first width A.

Figure 2:
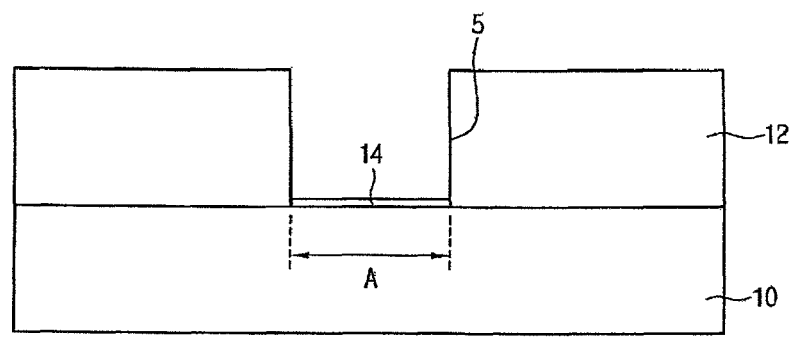

Referring to example FIG. 2, tunnel oxide layer 14 may be formed on and/or over semiconductor substrate 10. According to embodiments, tunnel oxide layer 14 may be formed at a bottom surface of trench 5. Tunnel oxide layer 14 may be formed through a thermal oxidation process, and may have first width A.

Figure 3:
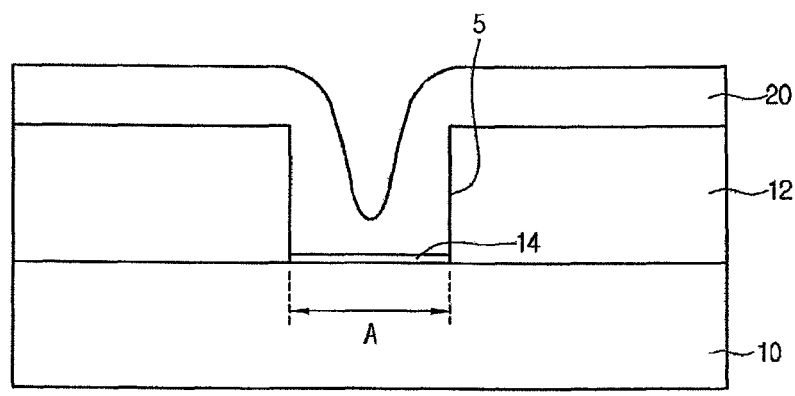

Referring to example FIG. 3, first polysilicon layer 20 may be formed on and/or over semiconductor substrate 10 provided with first oxide pattern 12 and tunnel oxide layer 14.

Figure 4:
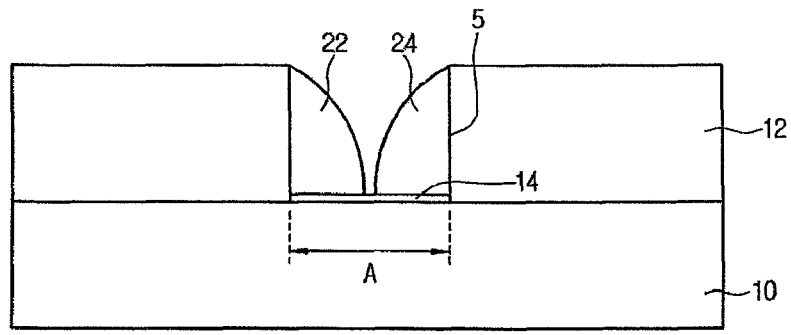

Referring to example FIG. 4, an anisotropic etching process may be performed on and/or over first polysilicon layer 20 and may form first polysilicon pattern 22 and second polysilicon pattern 24. During an anisotropic etching process, first and second polysilicon patterns 22 and 24 may be simultaneously formed. First polysilicon pattern 22 and second polysilicon pattern 24 may be formed on and/or over sidewalls of first oxide pattern 12, and tunnel oxide layer 14 may be partly exposed between first polysilicon pattern 22 and second polysilicon pattern 24. First and second polysilicon patterns 22 and 24 may serve as floating gates.

Figure 5:
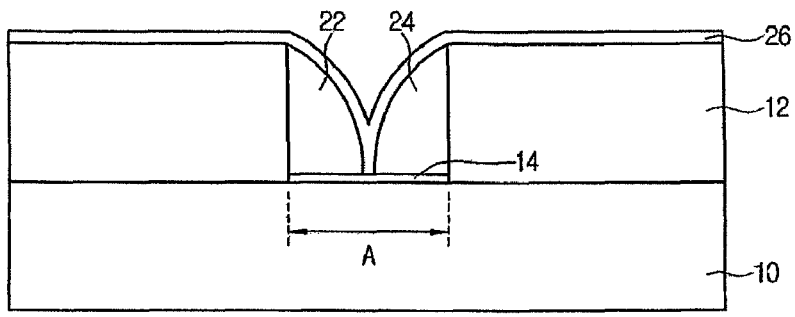

Referring to example FIG. 5, dielectric layer 26 may be formed on and/or over first oxide pattern 12, and first and second polysilicon patterns 22 and 24. Dielectric layer 26 may be an oxide-nitride-oxide (ONO) layer where a first oxide layer, a first nitride layer, and a second oxide layer may be sequentially formed. Dielectric layer 26 may insulate an overlying structure above dielectric layer 26 and an underlying structure below dielectric layer 26. According to embodiments, dielectric layer 26 may contact tunnel oxide layer 14 between first and second polysilicon patterns 22 and 24. According to embodiments, dielectric layer 26 may have an ONO structure, but may not be limited thereto. According to embodiments, dielectric layer 26 may have an oxide-nitride (ON) structure.

Figure 6:
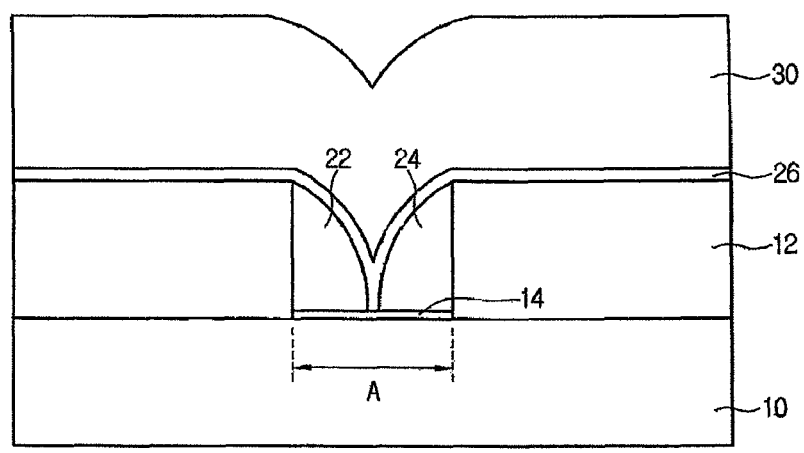

Referring to example FIG. 6, second polysilicon layer 30 may be formed on and/or over dielectric layer 26. Second polysilicon layer 30 may become a control gate.

Figure 7A:
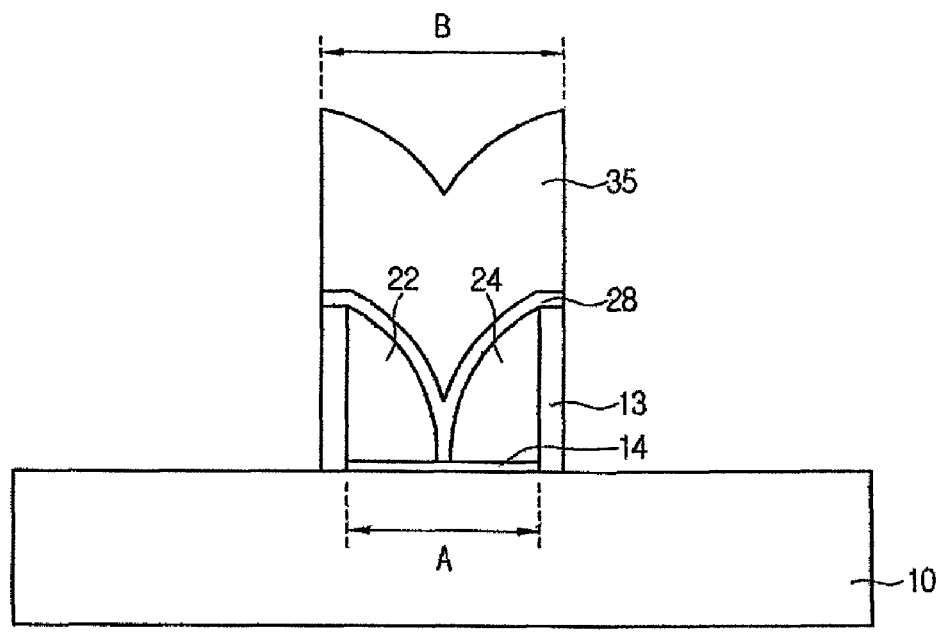

Referring to example FIG. 7A, second polysilicon layer 30, dielectric layer 26, and first oxide pattern 12 may be patterned. This may form third polysilicon pattern 35, dielectric pattern 28, and second oxide pattern 13. According to embodiments, to form third polysilicon pattern 35, dielectric pattern 28 and second oxide pattern 13, a photoresist pattern having second width B may be formed on and/or over second polysilicon layer 30. An etching process may then be performed. During an etching process, second oxide pattern 13 may be formed on and/or over sidewalls of tunnel oxide layer 14, and first and second polysilicon patterns 22 and 24. First dielectric pattern 28 and third polysilicon pattern 35, which may have second width B, may be formed on and/or over tunnel oxide layer 14, first and second polysilicon patterns 22 and 24, and second oxide pattern 13. Dielectric pattern 28 may contact tunnel oxide layer 14 between first and second polysilicon patterns 22 and 24. Second width B may be greater than first width A by approximately 10-20 nm. A patterning process for third polysilicon pattern 35 may be performed such that second width B may be greater than first width A. This may prevent a device from failing even if a misalignment occurs. If a misalignment occurs where second width B is equal to first width A, a device may fail because a misaligned control gate may not apply a same bias to first and second polysilicon patterns 22 and 24, which may be disposed thereunder.

Figure 7B:
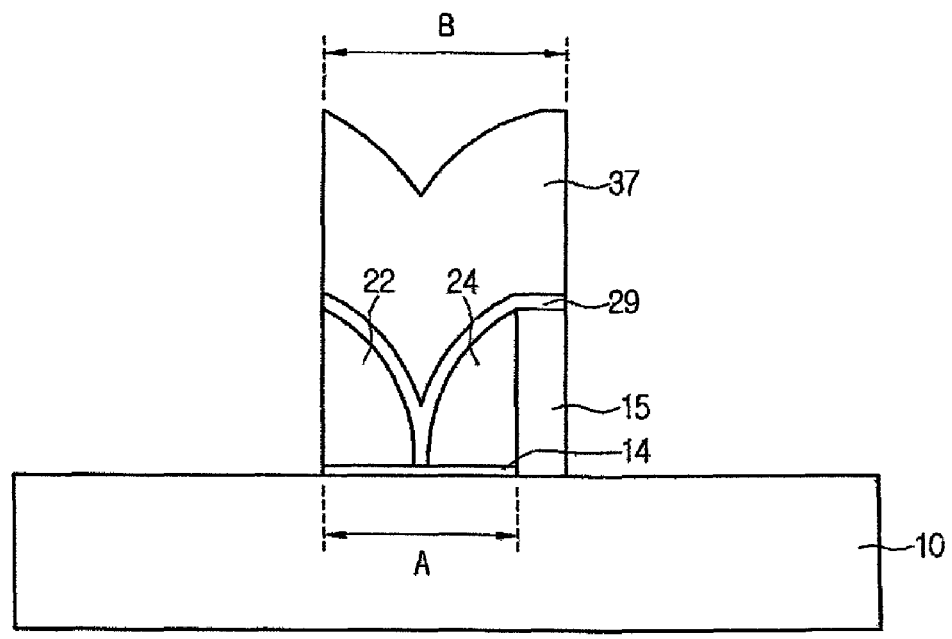

Referring to example FIG. 7B, if an alignment is not correct when second polysilicon layer 30, dielectric layer 26 and first oxide pattern 12 are patterned, a fourth polysilicon pattern 37 may lean to one side. Since there may be a tolerance in a range of approximately 10 to 20 nm while forming fourth polysilicon pattern 37, a same bias may be applied to first and second polysilicon patterns 22 and 24 disposed thereunder even though an alignment may not be correct.

Figure 8:
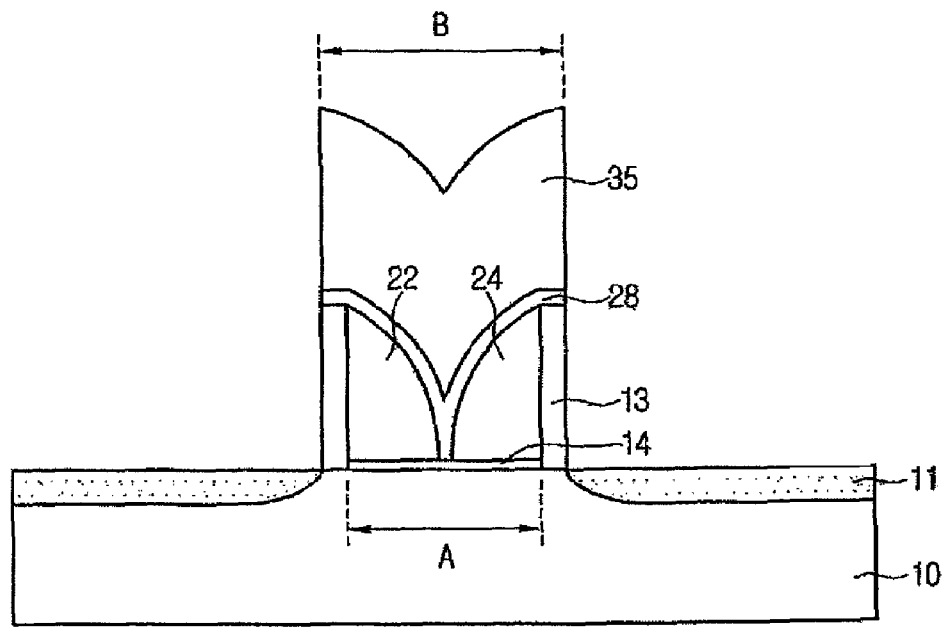

Referring to example FIG. 8, a lightly doped drain (LDD) region may be formed in semiconductor substrate 10.

Figure 9A:
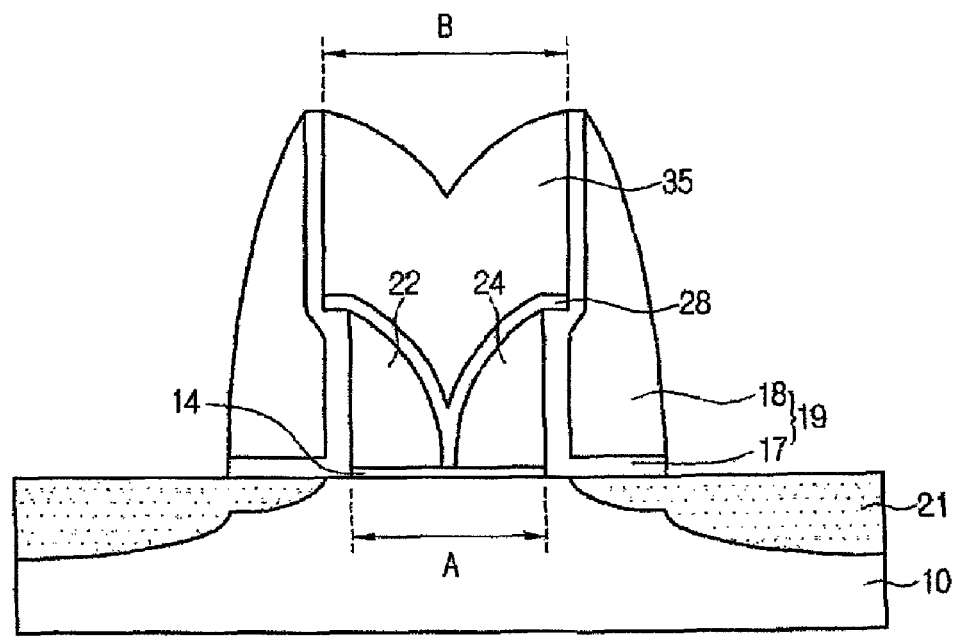

Referring to example FIG. 9A, first spacer 19 may be formed on and/or over sidewalls of first, second, and third polysilicon patterns 22, 24, and 35, tunnel oxide layer 14, and dielectric pattern 28. According to embodiments, source and drain regions 21 may be formed in semiconductor substrate 10. According to embodiments, first spacer 19 may have an oxide-nitride (ON) structure including third oxide layer 17 and second nitride layer 18.

Figure 9B:
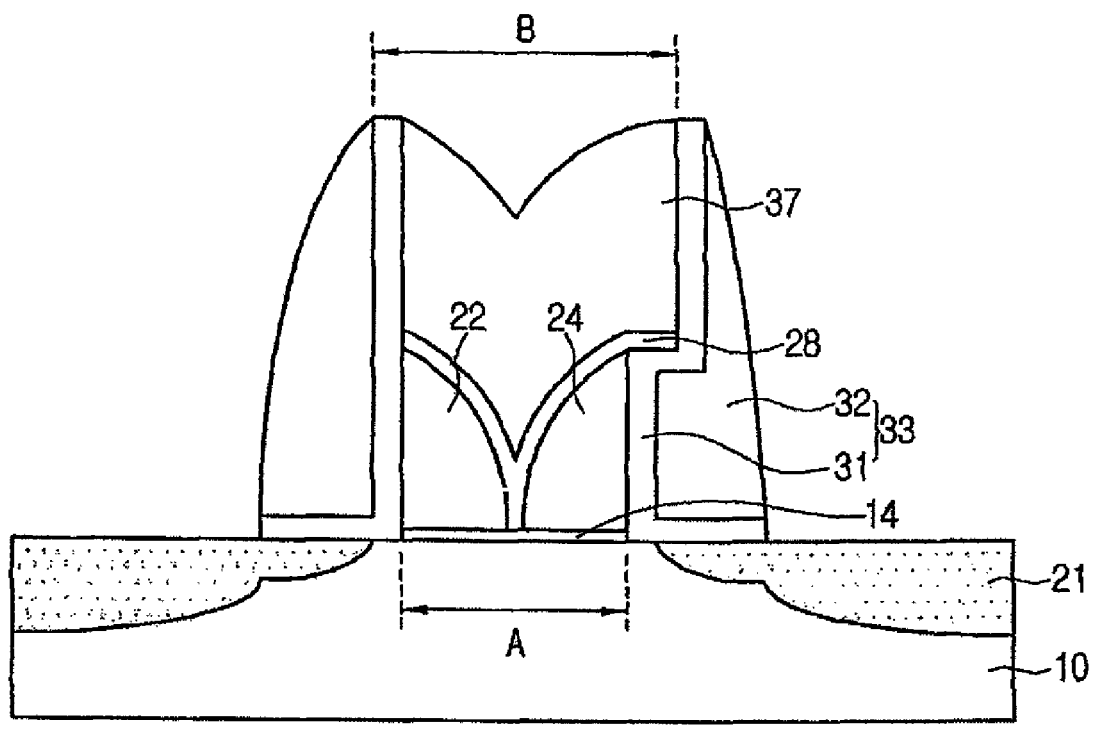

As illustrated in FIG. 9B, according to embodiments, if a misalignment occurs, second spacer 33 may be formed on and/or over sidewalls of first, second, and fourth polysilicon patterns 22, 24 and 37, tunnel oxide layer 14, and second dielectric pattern 29. According to embodiments, source and drain regions 21 may then be formed in semiconductor substrate 10. Second spacer 33 may have an oxide-nitride (ON) structure including fourth oxide layer 31 and third nitride layer 32. Since a same bias may be applied to both first and second polysilicon patterns 22 and 24 even if the fourth polysilicon pattern 37 leans to one side, a reliability of a flash memory device may be enhanced. According to embodiments, a salicide process may be performed, which may form a salicide layer on and/or over a region where a contact may be formed. A metal interconnection process may then be performed and may form metal interconnections.

According to embodiments, a flash memory device may allow a potential barrier on and/or over a surface of semiconductor substrate 10 under first and second polysilicon patterns 22 and 24 to be changed by exciting or emitting electrons or holes to first and second polysilicon patterns 22 and 24 under third polysilicon pattern 35 serving as a control gate. An electron flow may be adjusted by varying a potential barrier on and/or over a surface of semiconductor substrate 10. This may achieve a memory device that may include 4 bits per one cell, for example, 00, 01, 10 or 11.

Example FIG. 9 is a cross-sectional view illustrating a flash memory device according to embodiments. Example FIG. 9A illustrates a flash memory device where an overlying control gate may be aligned with an underlying floating gate.

Example FIG. 9B illustrates a flash memory device where an overlying control gate may be misaligned with an underlying floating gate.

Referring to example FIG. 9A, according to embodiments, a flash memory device may include tunnel oxide layer 14 on and/or over a semiconductor substrate 10. It may also include first polysilicon pattern 22 and second polysilicon pattern 24, dielectric pattern 28, third polysilicon pattern 35, and spacer 19. Semiconductor substrate 10 may include source and drain regions 21. First and second polysilicon patterns 22 and 24 may be formed on and/or over tunnel oxide layer 14. Dielectric pattern 28 and third polysilicon pattern 35 may be disposed on and/or over first and second polysilicon patterns 22 and 24 in sequence. Spacer 19 may be formed on and/or over sidewalls of first, second, and third polysilicon patterns 22, 24, and 35, dielectric pattern 28, and tunnel oxide layer 14. Tunnel oxide layer 14 may have first width A, and third polysilicon pattern 35 may have second width B. According to embodiments, second width B may be greater than first width A. Dielectric pattern 28 may partly contact tunnel oxide layer 14 between first and second polysilicon patterns 22 and 24. Dielectric pattern 28 may also have second width B substantially equal to a width of third polysilicon pattern 35.

Referring to example FIG. 9B, according to embodiments, a flash memory device where an overlying control gate may be misaligned with an underlying floating gate may include tunnel oxide layer 14 on and/or over a semiconductor substrate 10, first polysilicon pattern 22 and a second polysilicon pattern 24, dielectric pattern 29, fourth polysilicon pattern 37, and spacer 33. Tunnel oxide layer 14 may have first width A, and fourth polysilicon pattern 37 may have second width B. Second width B may be greater than first width A. According to embodiments, even if an overlying control gate is misaligned with an underlying floating gate, a same bias may be applied to fourth polysilicon pattern 37, which may be a control gate, and first and second polysilicon patterns 22 and 24, which may be floating gates. This may result in increased reliability of a flash memory device.

According to embodiments, a polysilicon pattern for a control gate may be patterned broadly as compared to a width of a floating gate formed thereunder. A substantially identical bias may be applied to the floating gate and the control gate, even if a misalignment occurs. Consequently, it may be possible to reduce failures of flash memory devices caused by a misalignment of a control gate. This may result in increased reliability of a flash memory device.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device comprising: a tunnel oxide layer having a first width over a semiconductor substrate, the semiconductor substrate including source and drain regions; a first polysilicon pattern and a second polysilicon pattern over the tunnel oxide layer; a dielectric pattern over the tunnel oxide layer and the first and second polysilicon patterns; and a third polysilicon pattern over the dielectric pattern, the third polysilicon pattern having a second width, wherein the second width is greater than the first width, wherein the tunnel oxide layer is formed only over a channel region of the substrate, and wherein there is only one tunnel oxide layer for the first polysilicon pattern, the second polysilicon pattern, and the third polysilicon pattern.

2. The device of claim 1, further comprising a spacer formed over sidewalls of the first, second, and third polysilicon patterns, the dielectric pattern, and the tunnel oxide layer.

3. The device of claim 1, wherein a width of the dielectric pattern is substantially the same as the second width of the third polysilicon pattern.

4. The device of claim 1, wherein the second width is greater than the first width by approximately 10-20 nm.

5. The device of claim 1, wherein the dielectric pattern contacts the tunnel oxide layer between the first polysilicon pattern and the second polysilicon pattern.

6. The device of claim 1, wherein a bias provided to the first polysilicon pattern and second polysilicon pattern is substantially identical to a bias provided to the third polysilicon pattern.

7. A device comprising; a tunnel oxide layer having a first width over a semiconductor substrate; a floating gate formed over the tunnel oxide layer; and a control gate formed over the floating gate, wherein a pattern for the floating gate has a first width and a pattern for the control gate has a second width, the second width being greater than the first width, wherein the tunnel oxide layer is formed only over a channel region of the substrate, and wherein there is only one tunnel oxide layer for the patterns for the floating gate and the control gate.

8. The device of claim 7, comprising:
a dielectric pattern over the tunnel oxide layer.

9. The device of claim 8, further comprising a spacer formed over sidewalls of the floating gate, the control gate, the dielectric pattern, and the tunnel oxide layer.

10. The device of claim 8, wherein the second width is greater than the first width by approximately 10-20 nm.

11. The device of claim 10, wherein a bias provided to the floating gate and the control gate is substantially identical.

* * * * *